US011626457B2

(12) United States Patent
Kim et al.

(10) Patent No.: US 11,626,457 B2
(45) Date of Patent: Apr. 11, 2023

(54) DISPLAY DEVICE INCLUDING EXTERNAL LIGHT-ABSORBING LAYER

(71) Applicant: Samsung Display Co., Ltd., Yongin-si (KR)

(72) Inventors: Hyangyul Kim, Yongin-si (KR); Jaehong Kim, Yongin-si (KR); Hyunho Jung, Yongin-si (KR); Sunhwa Kim, Yongin-si (KR); Hyomin Kim, Yongin-si (KR); Heeseong Jeong, Yongin-si (KR)

(73) Assignee: Samsung Display Co., Ltd., Yongin-si (KR)

( * ) Notice: Subject to any disclaimer, the term of this patent is extended or adjusted under 35 U.S.C. 154(b) by 190 days.

(21) Appl. No.: 16/918,973

(22) Filed: Jul. 1, 2020

(65) Prior Publication Data
US 2021/0183971 A1 Jun. 17, 2021

(30) Foreign Application Priority Data
Dec. 13, 2019 (KR) .......................... 10-2019-0167133

(51) Int. Cl.
*H01L 27/32* (2006.01)
*H01L 51/52* (2006.01)
(Continued)

(52) U.S. Cl.
CPC ...... *H01L 27/3246* (2013.01); *H01L 51/5253* (2013.01); *H01L 51/5284* (2013.01);
(Continued)

(58) Field of Classification Search
CPC ............... H01L 27/3246; H01L 27/326; H01L 27/3248; H01L 27/3258; H01L 27/3262;
(Continued)

(56) References Cited

U.S. PATENT DOCUMENTS 7,095,883 B2   8/2006   Safaee-Rad et al.
8,106,587 B2   1/2012   Park et al.
(Continued)

FOREIGN PATENT DOCUMENTS

KR   10-2008-0016428   2/2008
KR   10-2008-0057625   6/2008
(Continued)

*Primary Examiner* — Ida M Soward
(74) *Attorney, Agent, or Firm* — H.C. Park & Associates, PLC

(57) ABSTRACT

A display device having improved image quality characteristics including a substrate including a transmission area and an emission area defined by a pixel-defining layer; a display element including a pixel electrode at least partially exposed by the pixel-defining layer, an intermediate layer arranged on the pixel electrode, and an opposite electrode arranged on the intermediate layer; a thin film encapsulation layer arranged on the display element, the thin film encapsulation layer including at least one inorganic encapsulation layer and at least one organic encapsulation layer; and an external light-absorbing layer at least partially overlapping the emission area and arranged on the thin film encapsulation layer.

18 Claims, 10 Drawing Sheets

(51) Int. Cl.
  *G02F 1/13* (2006.01)
  *G02F 1/1335* (2006.01)
  *G02F 1/1362* (2006.01)
  *H01L 51/50* (2006.01)

(52) U.S. Cl.
  CPC .... *H01L 51/5293* (2013.01); *G02F 1/133512* (2013.01); *G02F 1/133528* (2013.01); *G02F 1/136209* (2013.01); *G09G 2300/0408* (2013.01); *G09G 2300/0804* (2013.01); *H01L 27/322* (2013.01); *H01L 27/3265* (2013.01); *H01L 51/5056* (2013.01); *H01L 51/5072* (2013.01); *H01L 51/5088* (2013.01); *H01L 51/5092* (2013.01); *H01L 51/525* (2013.01); *H01L 51/5218* (2013.01); *H01L 51/5246* (2013.01); *H01L 2251/301* (2013.01)

(58) Field of Classification Search
  CPC ............. H01L 27/3272; H01L 27/3244; H01L 27/322; H01L 51/5253; H01L 51/5284; H01L 51/5293; H01L 51/5281; H01L 51/5256; H01L 2251/301; H01L 2251/5307; H01L 27/3297; H01L 27/3265; H01L 51/525; H01L 51/5246; H01L 51/5218; H01L 51/5056; H01L 51/5072; H01L 51/5088; H01L 51/5092; G02F 1/133528; G02F 1/133512; G02F 1/136209; G02F 2001/133357; G09G 2300/0408; G09G 2300/0804
  See application file for complete search history.

(56) References Cited

U.S. PATENT DOCUMENTS

| | | | |
|---|---|---|---|
| 8,368,993 B2 | 2/2013 | Yeh et al. | |
| 8,373,624 B2 | 2/2013 | Chan et al. | |
| 9,825,259 B2 | 11/2017 | Wang et al. | |
| 2005/0140916 A1* | 6/2005 | Kume | G02F 1/133753 349/114 |
| 2006/0290845 A1* | 12/2006 | Hebrink | G02B 5/0247 349/113 |
| 2007/0077349 A1* | 4/2007 | Newman | H01L 51/5212 427/256 |
| 2008/0192352 A1* | 8/2008 | Laney | G02B 5/0278 359/599 |
| 2008/0260328 A1* | 10/2008 | Epstein | G02B 6/0028 385/32 |
| 2009/0009873 A1* | 1/2009 | Laney | G02B 5/0226 359/599 |
| 2009/0040772 A1* | 2/2009 | Laney | G02B 5/0289 362/353 |
| 2009/0201441 A1* | 8/2009 | Laney | G02F 1/133606 349/64 |
| 2009/0279175 A1* | 11/2009 | Laney | G02F 1/133606 428/411.1 |
| 2011/0025948 A1* | 2/2011 | Laney | G02F 1/133606 349/64 |
| 2014/0077183 A1* | 3/2014 | Lee | H01L 27/3258 257/40 |
| 2014/0320438 A1 | 10/2014 | Yurlov et al. | |
| 2016/0203744 A1 | 7/2016 | Duffy | |
| 2016/0343992 A1* | 11/2016 | Kim | H01L 51/5237 |
| 2017/0012493 A1 | 1/2017 | Fukushima et al. | |
| 2017/0124931 A1 | 5/2017 | Bell et al. | |
| 2017/0125744 A1* | 5/2017 | Kim | H01L 27/322 |
| 2017/0154927 A1* | 6/2017 | Jo | H01L 51/5284 |
| 2017/0154930 A1* | 6/2017 | Kim | H01L 27/322 |
| 2017/0155093 A1* | 6/2017 | Jo | G06F 1/163 |
| 2017/0324058 A1* | 11/2017 | Min | H04M 1/0266 |
| 2018/0026082 A1* | 1/2018 | Lee | G02F 1/133553 349/96 |
| 2018/0095566 A1* | 4/2018 | Lee | G06F 3/04164 |
| 2018/0181240 A1* | 6/2018 | Heo | H01L 27/322 |
| 2018/0182819 A1* | 6/2018 | Jo | H01L 51/5284 |
| 2019/0214440 A1* | 7/2019 | Lee | G06F 3/044 |
| 2019/0296088 A1* | 9/2019 | Kim | H01L 27/322 |
| 2020/0119113 A1* | 4/2020 | Lee | G06F 3/0446 |
| 2020/0144550 A1* | 5/2020 | Lee | H01L 51/5281 |
| 2020/0203669 A1* | 6/2020 | Shin | H01L 51/5253 |
| 2020/0219937 A1* | 7/2020 | Ahn | H01L 51/5284 |
| 2020/0266253 A1* | 8/2020 | Kim | H01L 27/3218 |
| 2020/0274089 A1* | 8/2020 | Son | H01L 51/525 |
| 2021/0020698 A1* | 1/2021 | Xian | H01L 27/323 |
| 2022/0085114 A1* | 3/2022 | Seong | H01L 27/322 |

FOREIGN PATENT DOCUMENTS

| | | |
|---|---|---|
| KR | 10-1510549 | 4/2015 |
| KR | 10-1617140 | 5/2016 |
| KR | 10-2016-0088488 | 7/2016 |
| KR | 10-2017-0063303 | 6/2017 |
| KR | 10-1837503 | 6/2017 |
| KR | 10-2018-0052576 | 5/2018 |

\* cited by examiner

DISPLAY DEVICE INCLUDING EXTERNAL LIGHT-ABSORBING LAYER

CROSS-REFERENCE TO RELATED APPLICATION

This application claims priority from and the benefit of Korean Patent Application No. 10-2019-0167133, filed on Dec. 13, 2019, which is hereby incorporated by reference for all purposes as if fully set forth herein.

BACKGROUND

Field

Exemplary embodiments/implementations of the invention relate generally to a display device and, more specifically, to a display device having improved image quality characteristics.

Discussion of the Background

Among display devices, an organic light-emitting display (OLED) device is attracting attention as a next generation display device because of its advantages of having a wide viewing angle, excellent contrast, and fast response speed.

Display devices include a plurality of pixels that receive an electrical signal and emit light in order to display an image to the outside. Each of the pixels includes a light-emitting device. For example, an OLED device includes an organic light-emitting diode as a light-emitting device. In general, the organic light-emitting display device includes a thin film transistor and an organic light-emitting diode on a substrate, and the organic light-emitting diode operates by emitting light by itself.

Recently, as use of the display devices has been diversified, they are used not only for products such as mobile phones and televisions but also for display units of products such as automobiles.

The above information disclosed in this Background section is only for understanding of the background of the inventive concepts, and, therefore, it may contain information that does not constitute prior art.

SUMMARY

According to one or more implementations/embodiments of the invention, a display device includes a substrate including a transmission area and an emission area defined by a pixel-defining layer; a display element including a pixel electrode at least partially exposed by the pixel-defining layer, an intermediate layer arranged on the pixel electrode, and an opposite electrode arranged on the intermediate layer; a thin film encapsulation layer arranged on the display element, the thin film encapsulation layer including at least one inorganic encapsulation layer and at least one organic encapsulation layer; and an external light-absorbing layer at least partially overlapping the emission area and arranged on the thin film encapsulation layer.

The pixel-defining layer may include a first opening exposing at least a portion of the pixel electrode, and the external light-absorbing layer may include a second opening exposing at least a portion of the thin film encapsulation layer.

The first opening in the pixel-defining layer may have a first width, and the second opening in the external light-absorbing layer may have a second width less than the first width.

The external light-absorbing layer may have a thickness of about 0.5 μm to about 3 μm and may be arranged on the thin film encapsulation layer.

The thin film encapsulation layer may include a first inorganic encapsulation layer arranged on the display element, an organic encapsulation layer arranged on the first inorganic encapsulation layer, and a second inorganic encapsulation layer arranged on the organic encapsulation layer.

The external light-absorbing layer may be arranged directly on the second inorganic encapsulation layer.

The display device may further include a spacer arranged on the pixel-defining layer, wherein the spacer and the pixel-defining layer include the same material.

The display device may further include a polarizing plate arranged on the external light-absorbing layer, and a plurality of light control films arranged on the polarizing plate and spaced apart from each other by a first distance.

Each of the light control films may form a first inclination angle with a first axis of a plane including the first axis extending in a first direction and a second axis extending in a second direction crossing the first direction, and may be arranged on the polarizing plate.

The first inclination angle may be 30 degrees or less.

The first distance may be about 35 μm to about 55 μm.

Each of the light control films may have a thickness of about 80 μm to about 120 μm and may be arranged on the polarizing plate.

At least a portion of the opposite electrode may extend toward the transmission area.

According to one or more implementations/embodiments of the invention, a display device includes a substrate including a transmission area and an emission area defined by a pixel-defining layer; a display element including a pixel electrode at least partially exposed by the pixel-defining layer, an intermediate layer arranged on the pixel electrode, and an opposite electrode arranged on the intermediate layer; a thin film encapsulation layer arranged on the display element, the thin film encapsulation layer including at least one inorganic encapsulation layer and at least one organic encapsulation layer; an external light-absorbing layer arranged on the thin film encapsulation layer; and a plurality of light control films arranged on the external light-absorbing layer and spaced apart from each other by a first distance.

The pixel-defining layer may include a first opening exposing at least a portion of the pixel electrode, and the external light-absorbing layer may include a second opening exposing at least a portion of the thin film encapsulation layer.

The first opening in the pixel-defining layer may have a first width, and the second opening in the external light-absorbing layer may have a second width less than the first width.

The external light-absorbing layer may at least partially overlap the emission area and may be arranged on the thin film encapsulation layer.

The display device may further include a polarizing plate arranged between the external light-absorbing layer and the plurality of light control films.

Each of the light control films may form a first inclination angle with a first axis of a plane including the first axis extending in a first direction and a second axis extending in a second direction crossing the first direction, and may be arranged on the polarizing plate.

The first inclination angle may be 30 degrees or less.

Other aspects, features, and advantages than the above-described aspects, features, and advantages will be apparent from a detailed description, the claims, and the drawings.

It is to be understood that both the foregoing general description and the following detailed description are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this specification, illustrate exemplary embodiments of the invention, and together with the description serve to explain the inventive concepts.

DETAILED DESCRIPTION

Figure 1:
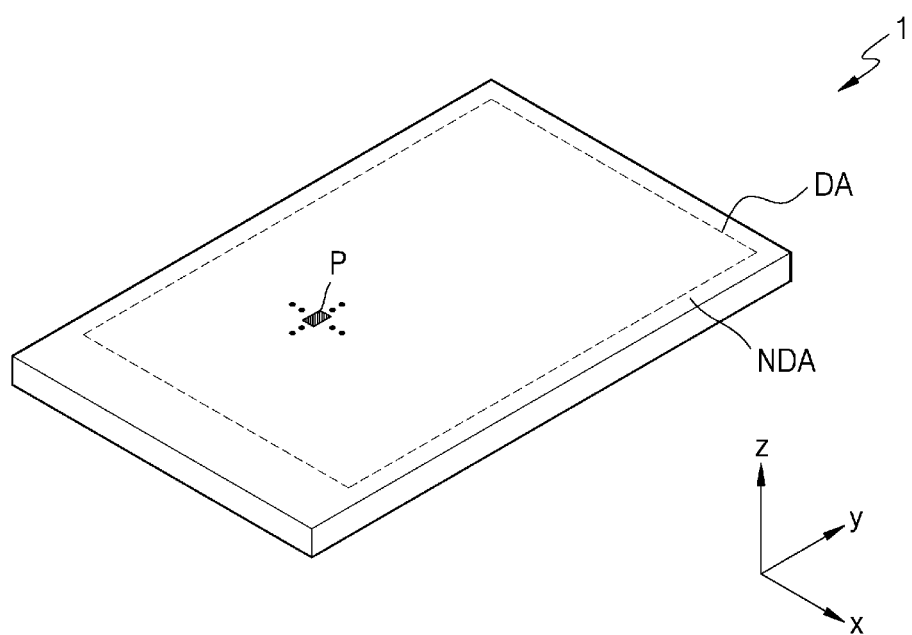
FIG. 1 is a perspective view schematically illustrating a display device according to embodiments described herein.

In the following description, for the purposes of explanation, numerous specific details are set forth in order to provide a thorough understanding of various exemplary embodiments or implementations of the invention. As used herein "embodiments" and "implementations" are interchangeable words that are non-limiting examples of devices or methods employing one or more of the inventive concepts disclosed herein. It is apparent, however, that various exemplary embodiments may be practiced without these specific details or with one or more equivalent arrangements. In other instances, well-known structures and devices are illustrated in block diagram form in order to avoid unnecessarily obscuring various exemplary embodiments. Further, various exemplary embodiments may be different, but do not have to be exclusive. For example, specific shapes, configurations, and characteristics of an exemplary embodiment may be used or implemented in another exemplary embodiment without departing from the inventive concepts.

The use of cross-hatching and/or shading in the accompanying drawings is generally provided to clarify boundaries between adjacent elements. As such, neither the presence nor the absence of cross-hatching or shading conveys or indicates any preference or requirement for particular materials, material properties, dimensions, proportions, commonalities between illustrated elements, and/or any other characteristic, attribute, property, etc., of the elements, unless specified. Further, in the accompanying drawings, the size and relative sizes of elements may be exaggerated for clarity and/or descriptive purposes. When an exemplary embodiment may be implemented differently, a specific process order may be performed differently from the described order. For example, two consecutively described processes may be performed substantially at the same time or performed in an order opposite to the described order. Also, like reference numerals denote like elements. When an element, such as a layer, is referred to as being "on," "connected to," or "coupled to" another element or layer, it may be directly on, connected to, or coupled to the other element or layer or intervening elements or layers may be present. When, however, an element or layer is referred to as being "directly on," "directly connected to," or "directly coupled to" another element or layer, there are no intervening elements or layers present. To this end, the term "connected" may refer to physical, electrical, and/or fluid connection, with or without intervening elements. Further, the D1-axis, the D2-axis, and the D3-axis are not limited to three axes of a rectangular coordinate system, such as the x, y, and z axes, and may be interpreted in a broader sense. For example, the D1-axis, the D2-axis, and the D3-axis may be perpendicular to one another, or may represent different directions that are not perpendicular to one another. For the purposes of this disclosure, "at least one of X, Y, and Z" and "at least one selected from the group consisting of X, Y, and Z" may be construed as X only, Y only, Z only, or any combination of two or more of X, Y, and Z, such as, for instance, XYZ, XYY, YZ, and ZZ. As used herein, the term "and/or" includes any and all combinations of one or more of the associated listed items.

As used herein, the term "and/or" includes any and all combinations of one or more of the associated listed items. Throughout the disclosure, the expression "at least one of a, b or c" indicates only a, only b, only c, both a and b, both a and c, both b and c, all of a, b, and c, or variations thereof. Thus, a first element discussed below could be termed a second element without departing from the teachings of the disclosure.

It will be understood that although terms such as "first" and "second" may be used herein to describe various components, these components should not be limited by these terms and these terms are only used to distinguish one component from another component. Also, as used herein, the singular forms "a," "an," and "the" are intended to include the plural forms as well, unless the context clearly indicates otherwise.

Spatially relative terms, such as "beneath," "below," "under," "lower," "above," "upper," "over," "higher," "side" (e.g., as in "sidewall"), and the like, may be used herein for descriptive purposes, and, thereby, to describe one elements relationship to another element(s) as illustrated in the drawings. Spatially relative terms are intended to encompass different orientations of an apparatus in use, operation, and/or manufacture in addition to the orientation depicted in the drawings. For example, if the apparatus in the drawings is turned over, elements described as "below" or "beneath" other elements or features would then be oriented "above" the other elements or features. Thus, the exemplary term "below" can encompass both an orientation of above and below. Furthermore, the apparatus may be otherwise oriented (e.g., rotated 90 degrees or at other orientations), and, as such, the spatially relative descriptors used herein interpreted accordingly.

The terminology used herein is for the purpose of describing particular embodiments and is not intended to be limiting. As used herein, the singular forms, "a," "an," and "the" are intended to include the plural forms as well, unless the context clearly indicates otherwise. Moreover, the terms "comprises," "comprising," "includes," and/or "including," when used in this specification, specify the presence of stated features, integers, steps, operations, elements, components, and/or groups thereof, but do not preclude the presence or addition of one or more other features, integers, steps, operations, elements, components, and/or groups thereof. It is also noted that, as used herein, the terms "substantially," "about," and other similar terms, are used as terms of approximation and not as terms of degree, and, as such, are utilized to account for inherent deviations in measured, calculated, and/or provided values that would be recognized by one of ordinary skill in the art. Various exemplary embodiments are described herein with reference to sectional and/or exploded illustrations that are schematic illustrations of idealized exemplary embodiments and/or intermediate structures. As such, variations from the shapes of the illustrations as a result, for example, of manufacturing techniques and/or tolerances, are to be expected. Thus, exemplary embodiments disclosed herein should not necessarily be construed as limited to the particular illustrated shapes of regions, but are to include deviations in shapes that result from, for instance, manufacturing. In this manner, regions illustrated in the drawings may be schematic in nature and the shapes of these regions may not reflect actual shapes of regions of a device and, as such, are not necessarily intended to be limiting.

Unless otherwise defined, all terms (including technical and scientific terms) used herein have the same meaning as commonly understood by one of ordinary skill in the art to which this disclosure is a part. Terms, such as those defined in commonly used dictionaries, should be interpreted as having a meaning that is consistent with their meaning in the context of the relevant art and should not be interpreted in an idealized or overly formal sense, unless expressly so defined herein.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description.

FIG. 1 is a perspective view schematically illustrating a display device 1 according to embodiments described herein.

Referring to FIG. 1, the display device 1 may include a display area DA and a non-display area NDA arranged around the display area DA. The non-display area NDA may surround the display area DA. The display device 1 may provide an image by using light emitted from a plurality of pixels P arranged in the display area DA, and the non-display area NDA may be an area where no image is displayed.

Although an organic light-emitting display device is described as an example of the display device 1 according to an embodiment, the display device of the present disclosure is not limited thereto. In an embodiment, the display device 1 of the present disclosure may be an inorganic light-emitting display device (or an inorganic electroluminescence (EL) display device) or may be a display device such as a quantum dot light-emitting display device. For example, an emission layer of a display element included in the display device 1 may include an organic material, may include an inorganic material, may include quantum dots, may include an organic material and quantum dots, or may include an inorganic material and quantum dots.

Although FIG. 1 illustrates the display device 1 having a flat display surface, the present disclosure is not limited thereto. In an embodiment, the display device 1 may include a three-dimensional display surface or a curved display surface.

When the display device 1 includes a three-dimensional display surface, the display device 1 may include a plurality of display areas indicating different directions and may include, for example, a polygonal columnar display surface. In an embodiment, when the display device 1 includes a curved display surface, the display device 1 may be implemented in various forms such as flexible, foldable, and rollable display devices.

FIG. 1 illustrates a display device 1 that may be applied to a mobile phone terminal. Although not illustrated, a mobile phone terminal may be constructed by arranging electronic modules, a camera module, a power module, and the like mounted on a main board, together with the display device 1 in a bracket/case or the like. The display device 1 according to the present disclosure may be applied to large electronic apparatuses such as televisions or monitors and small and medium electronic apparatuses such as tablets, car navigations, game machines, or smart watches. In particular, the display device 1 may be used as a heads-up display (HUD).

Although FIG. 1 illustrates a case where the display area DA of the display device 1 is tetragonal, the shape of the display area DA may also be circular, elliptical, or polygonal such as triangular or pentagonal.

Figure 2:
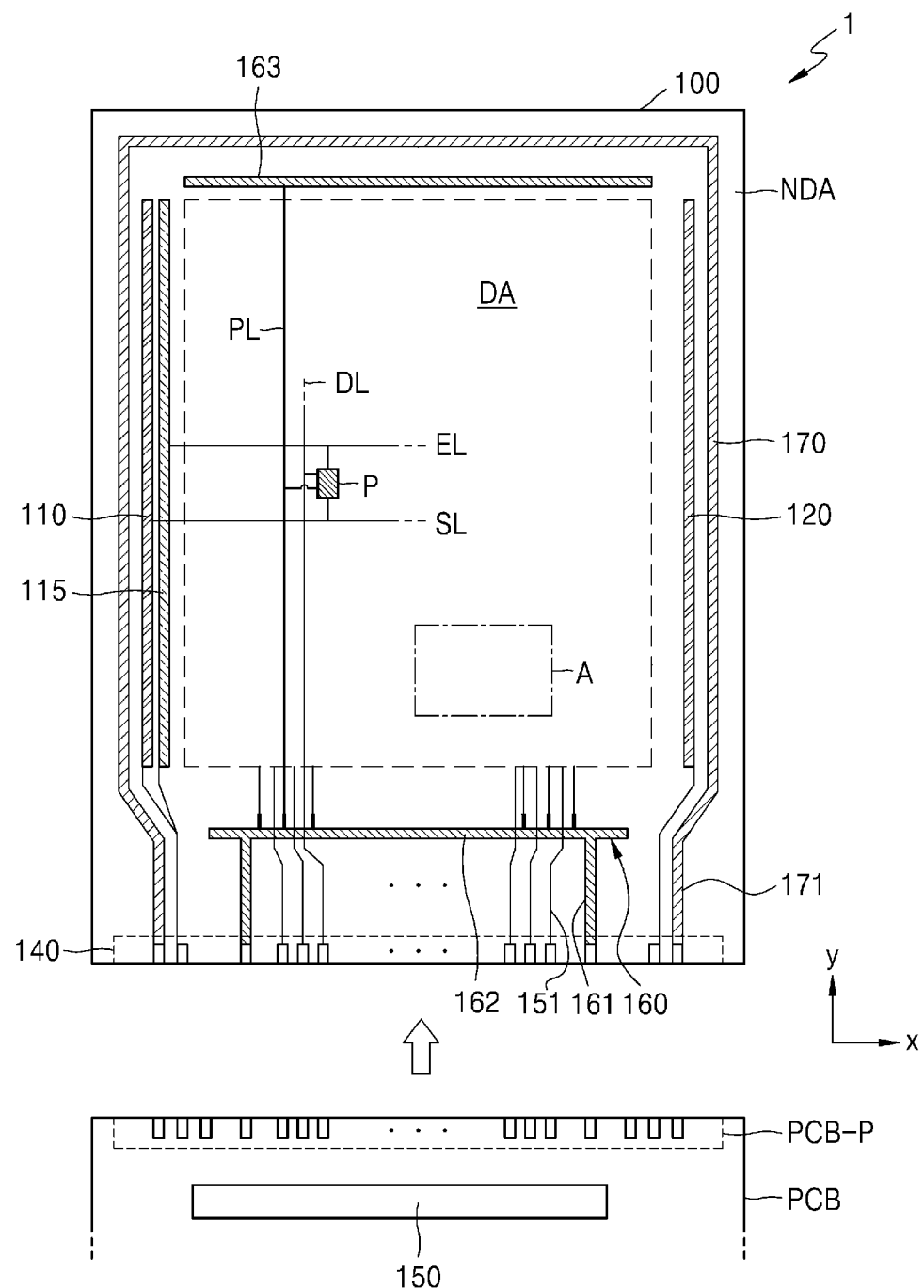
FIG. 2 is a plan view schematically illustrating a portion of a display device according to embodiments described herein.

FIG. 2 is a plan view schematically illustrating a portion of a display device 1 according to embodiments described herein.

Referring to FIG. 2, the display device 1 may include a plurality of pixels P arranged in a display area DA. Each of the plurality of pixels P may include a display element, such as an organic light-emitting diode OLED. Each of the plurality of pixels P may emit, for example, red, green, blue, or white light through the organic light-emitting diode OLED. The pixel P used herein will be understood as a pixel that emits one of red, green, blue, and white light, as described above.

Each pixel P may be electrically connected to outer circuits arranged in the non-display area NDA. A first scan driving circuit 110, a first emission driving circuit 115, a second scan driving circuit 120, a terminal 140, a data driving circuit 150, a first power supply line 160, and a second power supply line 170 may be arranged in the non-display area NDA.

The first scan driving circuit 110 may provide a scan signal to each pixel P via a scan line SL. The first emission driving circuit 115 may provide an emission control signal to each pixel P via an emission control line EL. The second scan driving circuit 120 may be arranged in parallel to the first scan driving circuit 110 with the display area DA therebetween. Some of the pixels P arranged in the display area DA may be electrically connected to the first scan driving circuit 110, and the rest thereof may be electrically connected to the second scan driving circuit 120. In an embodiment, a second emission driving circuit (not illustrated) may be arranged in parallel to the first emission driving circuit 115 with the display area DA there between.

The first emission driving circuit 115 may be spaced apart from the first scan driving circuit 110 in a first direction (i.e., x-direction) and arranged in the non-display area NDA. In an embodiment, the first emission driving circuit 115 may be arranged alternately with the first scan driving circuit 110 in a second direction (i.e., y-direction).

The terminal 140 may be arranged in one side of a substrate 100. The terminal 140 may be covered by an insulating layer (not illustrated). In other embodiments as illustrated in FIG. 2 the terminal 140 may not be covered by an insulating layer. The terminal 140 may be exposed and thus may be electrically connected to a printed circuit board PCB. A terminal PCB-P of the printed circuit board PCB may be electrically connected to the terminal 140 of the display device 1. The printed circuit board PCB may be configured to deliver signals or power of a controller (not illustrated) to the display device 1. Control signals generated by the controller (not illustrated) may be delivered to each of the first scan driving circuit 110, the first emission driving circuit 115, and the second scan driving circuit 120 through the printed circuit board PCB. The controller may provide a first power supply voltage ELVDD and a second power supply voltage ELVSS to the first power supply line 160 and the second power supply line 170 via a first connection line 161 and a second connection line 171, respectively. The first power supply voltage ELVDD may be provided to the pixel P via a driving voltage line PL connected to the first power supply line 160, and the second power supply voltage ELVSS may be provided to an opposite electrode of the pixel P connected to the second power supply line 170.

The data driving circuit 150 is electrically connected to data lines DL. Data signals of the data driving circuit 150 may be provided to each pixel P via a connection line 151 connected to the terminal 140 and the data line DL connected to the connection line 151.

FIG. 2 illustrates that the data driving circuit 150 is arranged on the printed circuit board PCB. However, in an alternative embodiment, the data driving circuit 150 may be arranged on the substrate 100. For example, the data driving circuit 150 may be arranged between the terminal 140 and the first power supply line 160.

The first power supply line 160 may include a first sub-line 162 and a second sub-line 163, which extend in parallel to each other in the first direction (i.e., x-direction) with the display area DA there between. The second power supply line 170 may have a shape of a loop with one open side adjacent the terminal 140 and may surround the display area DA partially.

Figure 3:
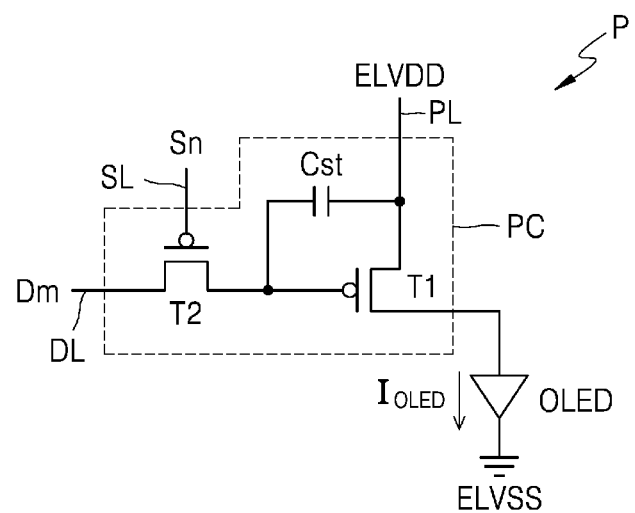
FIGS. 3 and 4 are equivalent circuit diagrams of a pixel that may be included in a display device according to embodiments described herein.
Figure 4:
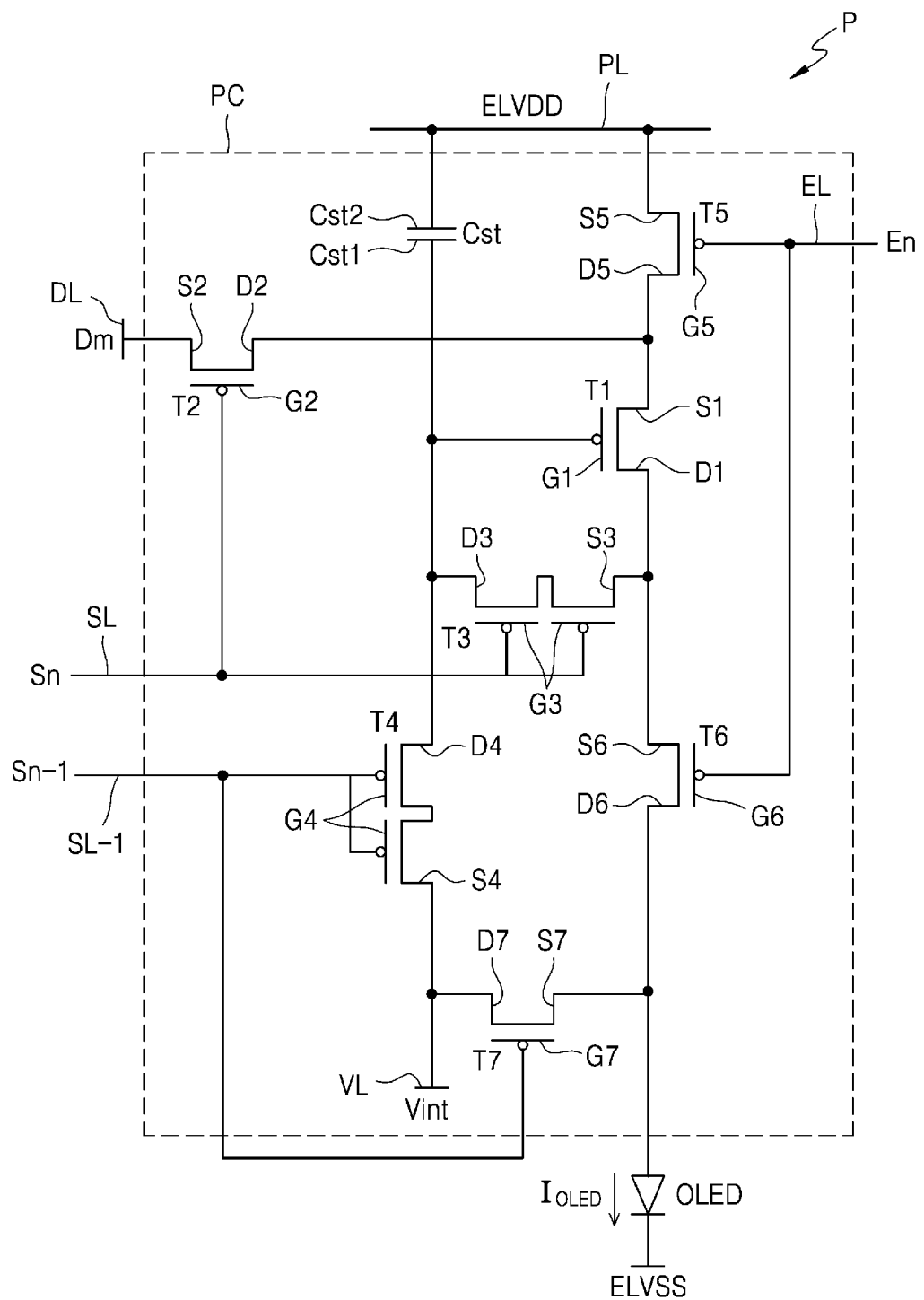

FIGS. 3 and 4 are equivalent circuit diagrams of a pixel P that may be included in a display device 1 according to embodiments described herein.

Referring to FIG. 3, each pixel P includes a pixel circuit PC including a scan line SL, a data line DL, and a display element, e.g., an organic light-emitting diode OLED, connected within the pixel circuit PC.

The pixel circuit PC includes a driving thin film transistor T1, a switching thin film transistor T2, and a storage capacitor Cst. The switching thin film transistor T2 is connected to the scan line SL and the data line DL and is configured to deliver a data signal Dm to the driving thin film transistor T1. The data signal Dm is input via the data line DL according to a scan signal Sn input via the scan line SL.

The storage capacitor Cst is connected between the switching thin film transistor T2 and a driving voltage line PL. The storage capacitor Cst is configured to store a voltage corresponding to a difference between the voltage received from the switching thin film transistor T2 and the first power supply voltage ELVDD (or a driving voltage) supplied to the driving voltage line PL.

The driving thin film transistor T1 may be connected to the driving voltage line PL and the storage capacitor Cst and may control a driving current IOLED that flows through the organic light-emitting diode OLED from the driving voltage line PL. The driving current IOLED also factors in a voltage value stored in the storage capacitor Cst. The organic light-emitting diode OLED may emit light with certain brightness according to the driving current IOLED.

In FIG. 3, the pixel circuit PC includes two thin film transistors and one storage capacitor. However, the present disclosure is not limited thereto. As illustrated in FIG. 4, the pixel circuit PC may include a multiplicity such as seven thin film transistors and one storage capacitor.

Referring to FIG. 4, each pixel P includes a pixel circuit PC and a display element, for example, an organic light-emitting diode OLED, connected to the pixel circuit PC. The pixel circuit PC may include a plurality of thin film transistors and a storage capacitor. The thin film transistors and the storage capacitor may be connected to scan lines SL and SL−1, signal lines EL, and DL, an initialization voltage line VL, and a driving voltage line PL.

In FIG. 4, each pixel P is connected to the scan lines SL and SL−1, signal lines EL, and DL, the initialization voltage line VL, and the driving voltage line PL. However, the present disclosure is not limited thereto. In an embodiment, at least one of the scan lines SL and SL−1, signal lines EL, and DL, the initialization voltage line VL, and the driving voltage line PL may be shared by neighboring pixels.

The plurality of thin film transistors may include a driving thin film transistor T1, a switching thin film transistor T2, a compensation thin film transistor T3, a first initialization thin film transistor T4, an operation control thin film transistor T5, an emission control thin film transistor T6, and a second initialization thin film transistor T7.

The signal lines include the scan line SL configured to transfer a scan signal Sn, a previous scan line SL−1 configured to transfer a previous scan signal Sn−1 to the first initialization thin film transistor T4 and the second initialization thin film transistor T7, and an emission control line EL configured to transfer an emission control signal En to the operation control thin film transistor T5 and the emission control thin film transistor T6. The signal lines also include a data line DL that intersects with the scan line SL and is configured to transfer a data signal Dm. The driving voltage line PL is configured to transfer the driving voltage ELVDD to the driving thin film transistor T1. The initialization voltage line VL is configured to transfer an initialization voltage Vint to initialize the driving thin film transistor T1 and a pixel electrode of the organic light-emitting diode OLED.

Referring to connection schemes of the equivalent circuit diagram of FIG. 4, a driving gate electrode G1 of the driving thin film transistor T1 is connected to a first storage capacitor plate Cst1 of the storage capacitor Cst. A driving source electrode S1 of the driving thin film transistor T1 is connected to a lower driving voltage line, i.e., the driving voltage line PL, via the operation control thin film transistor T5. A driving drain electrode D1 of the driving thin film transistor T1 is electrically connected to the pixel electrode of the organic light-emitting diode OLED via the emission control thin film transistor T6. The driving thin film transistor T1 receives the data signal Dm according to a switching operation of the switching thin film transistor T2 configured to supply a driving current IOLED to the organic light-emitting diode OLED.

A switching gate electrode G2 of the switching thin-film transistor T2 is connected to the scan line SL and a switching source electrode S2 of the switching thin film transistor T2 is connected to the data line DL. A switching drain electrode D2 of the switching thin film transistor T2 is connected to the driving source electrode S1 of the driving thin film transistor T1. The switching drain electrode D2 is also connected to the lower driving voltage line, i.e., the driving voltage line PL, via the operation control thin film transistor T5. The switching thin film transistor T2 is turned on according to the scan signal Sn received through the scan line SL and performs a switching operation to transfer the data signal Dm through the data line DL to the driving source electrode S1 of the driving thin film transistor T1.

A compensation gate electrode G3 of the compensation thin film transistor T3 is connected to the scan line SL. A compensation source electrode S3 of the compensation thin film transistor T3 is connected to the driving drain electrode D1 of the driving thin film transistor T1. The compensation source electrode S3 is also connected to the pixel electrode of the organic light-emitting diode OLED via the emission control thin film transistor T6. A compensation drain electrode D3 of the compensation thin film transistor T3 is connected to the first storage capacitor plate Cst1 of the storage capacitor Cst, a first initialization drain electrode D4 of the first initialization thin film transistor T4, and the driving gate electrode G1 of the driving thin film transistor T1. The compensation thin film transistor T3 is turned on according to the scan signal Sn received through the scan line SL to electrically connect the driving gate electrode G1 and the driving drain electrode D1 of the driving thin film transistor T1 to each other and to diode-connect the driving thin film transistor T1.

A first initialization gate electrode G4 of the first initialization thin film transistor T4 is connected to the previous scan line SL−1. A first initialization source electrode S4 of the first initialization thin film transistor T4 is connected to a second initialization drain electrode D7 of the second initialization thin film transistor T7 and the initialization voltage line VL. The first initialization drain electrode D4 of the first initialization thin film transistor T4 is connected to the first storage capacitor plate Cst1 of the storage capacitor Cst, the compensation drain electrode D3 of the compensation thin film transistor T3, and the driving gate electrode G1 of the driving thin film transistor T1. The first initialization thin film transistor T4 is turned on according to a previous scan signal Sn−1 transferred through the previous scan line SL−1. The first initialization thin film transistor T4 is configured to transfer the initialization voltage Vint to the driving gate electrode G1 of the driving thin film transistor T1 and perform an initialization operation to initialize a voltage at the driving gate electrode G1 of the driving thin film transistor T1.

An operation control gate electrode G5 of the operation control thin film transistor T5 is connected to the emission control line EL. An operation control source electrode S5 of the operation control thin film transistor T5 is connected to the lower driving voltage line, i.e., the driving voltage line PL. An operation control drain electrode D5 of the operation control thin film transistor T5 is connected to the driving source electrode S1 of the driving thin film transistor T1 and to the switching drain electrode D2 of the switching thin film transistor T2.

An emission control gate electrode G6 of the emission control thin film transistor T6 is connected to the emission control line EL. An emission control source electrode S6 of the emission control thin film transistor T6 is connected to the driving drain electrode D1 of the driving thin film transistor T1 and to the compensation source electrode S3 of the compensation thin film transistor T3. An emission control drain electrode D6 of the emission control thin film transistor T6 is electrically connected to a second initialization source electrode S7 of the second initialization thin film transistor T7 and to the pixel electrode of the organic light-emitting diode OLED.

The operation control thin film transistor T5 and the emission control thin film transistor T6 may be simultaneously turned on according to the emission control signal En transferred through the emission control line EL, and are configured to transfer the driving voltage ELVDD to the organic light-emitting diode OLED and allow the driving current IOLED to flow into the organic light-emitting diode OLED.

The second initialization gate electrode G7 of the second initialization thin film transistor T7 is connected to the previous scan line SL−1. A second initialization source electrode S7 of the second initialization thin film transistor T7 is connected to the emission control drain electrode D6 of the emission control thin film transistor T6 and to the pixel electrode of the organic light-emitting diode OLED. A second initialization drain electrode D7 of the second initialization thin film transistor T7 is connected to the first initialization source electrode S4 of the first initialization thin film transistor T4 and the initialization voltage line VL. The second initialization thin film transistor T7 is turned on according to the previous scan signal Sn−1 transferred through the previous scan line SL−1 to initialize the pixel electrode of the organic light-emitting diode OLED.

FIG. 4 illustrates an example in which the first initialization thin film transistor T4 and the second initialization thin film transistor T7 are connected to the previous scan line SL−1. However, the present disclosure is not limited thereto. In an embodiment, the first initialization thin film transistor T4 may be connected to the previous scan line SL−1 to operate according to the previous scan signal Sn−1, and the second initialization thin film transistor T7 may be connected to a separate signal line (e.g., a post scan line) to operate according to a signal transferred to the separate signal line.

A second storage capacitor plate Cst2 of the storage capacitor Cst is connected to the driving voltage line PL, and an opposite electrode of the organic light-emitting diode OLED is connected to a common voltage, i.e., the second power supply voltage ELVSS. Accordingly, the organic light-emitting diode OLED emits light by receiving the driving current IOLED from the driving thin film transistor T1 to display images.

In FIG. 4, the compensation thin film transistor T3 and the first initialization thin film transistor T4 have dual-gate electrodes, but embodiments are not limited thereto. The compensation thin film transistor T3 and the first initialization thin film transistor T4 may each have one gate electrode.

Figure 5A:
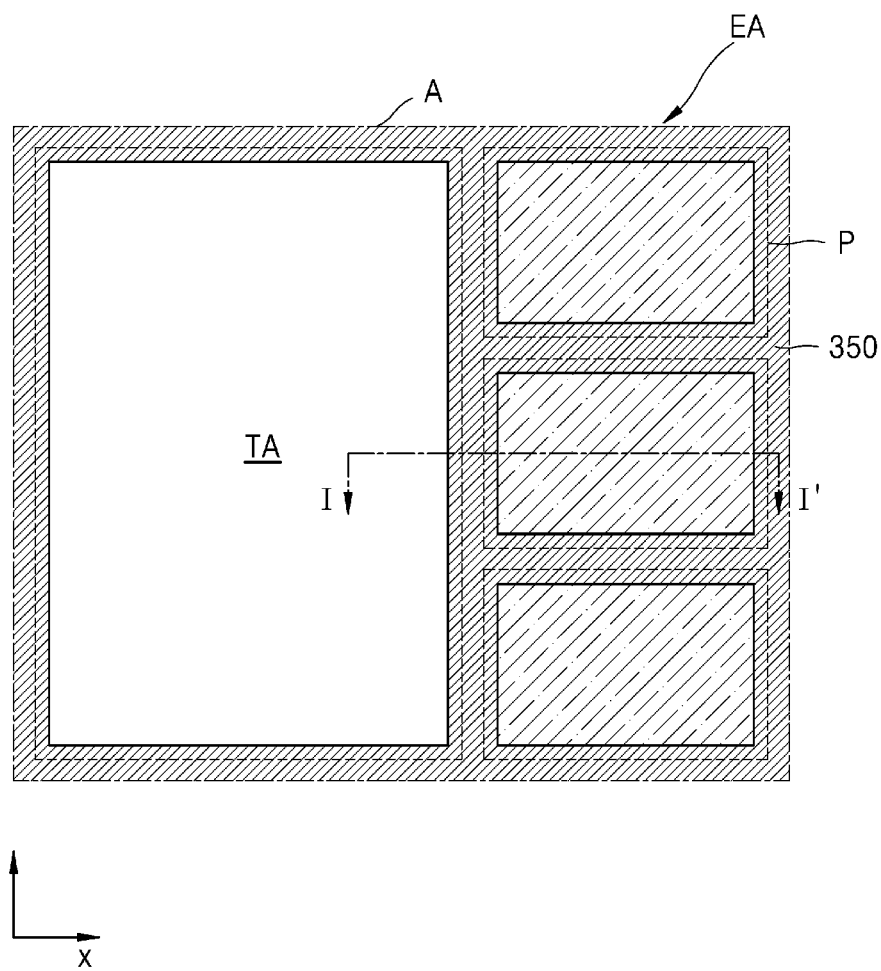
FIGS. 5A and 5B are plan views illustrating a portion of a display area in a display device according to embodiments described herein.
Figure 5B:
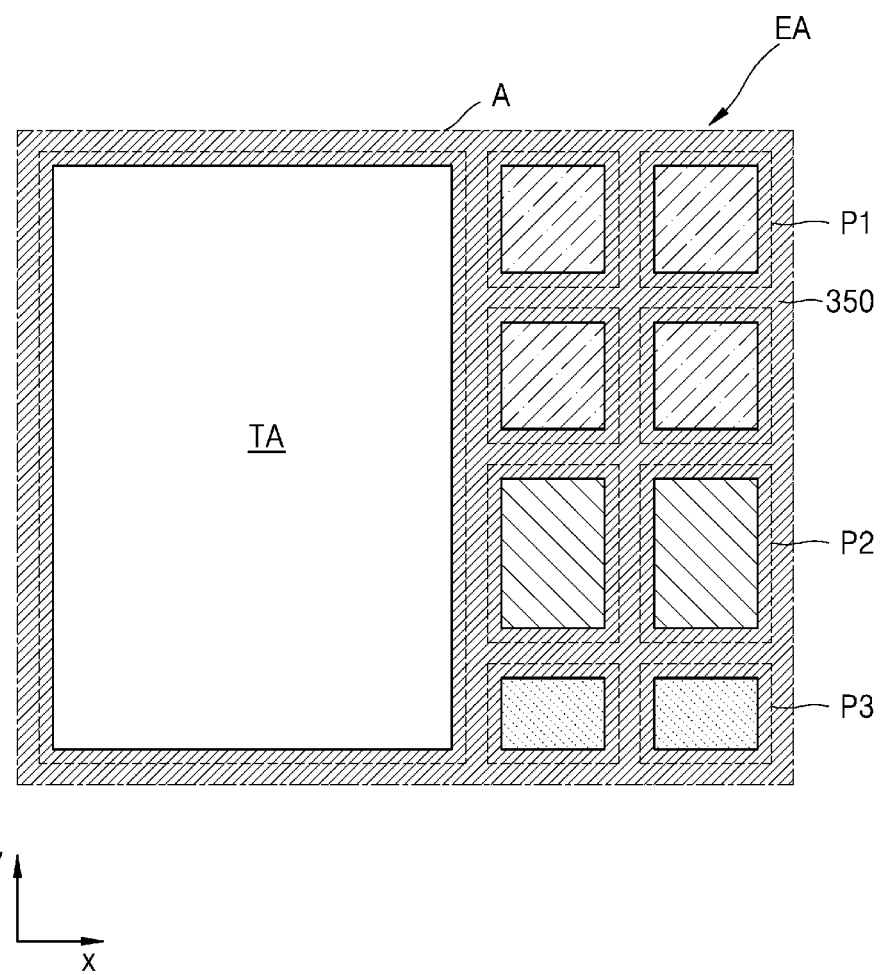
Figure 6:
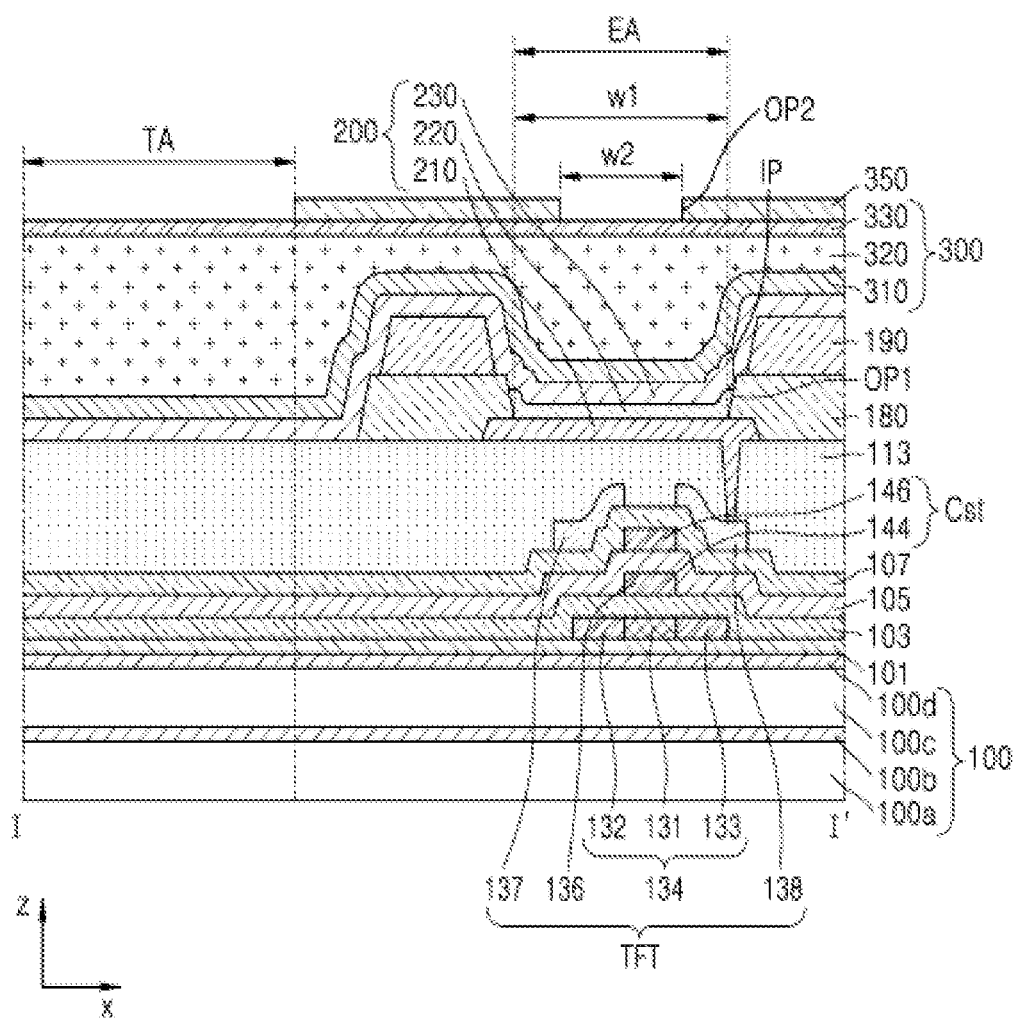
FIG. 6 is a cross-sectional view schematically illustrating a display device according to an embodiment.

FIGS. 5A and 5B are plan views illustrating a portion of a display area DA in a display device 1 according to embodiments described herein. FIG. 6 is a cross-sectional view schematically illustrating a display device 1 according to embodiments described herein.

More specifically, FIGS. 5A and 5B are enlarged views of a portion A of the display area DA of FIG. 2, and FIG. 6 is a cross-sectional view taken along line I-I' of FIG. 5A.

Referring to FIGS. 5A and 6, a substrate 100 of the display device 1 according to exemplary embodiments may include an emission area EA in which a pixel P is arranged and light is emitted, and a transmission area TA in which the pixel P is not arranged and light is not emitted. In order to improve the transmittance of the display device, the transmission area TA may be larger than the pixel P. The pixel P may include a display element such as an organic light-emitting diode to emit light having a red, green, blue, or white wavelength. In an embodiment, as illustrated in FIG. 5A, three pixels P may be arranged corresponding to one transmission area TA, and as illustrated in FIG. 5B, four first pixels P1, two second pixels P2, and two third pixels P3 may be arranged corresponding to one transmission area TA. In this case, the first pixel P1 may emit light having a blue wavelength, the second pixel P2 may emit light having a green wavelength, and the third pixel P3 may emit light having a red wavelength.

An external light-absorbing layer 350 may be arranged between the pixel P and the transmission area TA, between pixels P, and along the periphery of the transmission area TA. The external light-absorbing layer 350 may be arranged on a thin film encapsulation layer 300, but the thin film encapsulation layer 300 is omitted in FIG. 5A for convenience of description and illustration. The external light-absorbing layer 350 may include a black resin, a dye, or the like, which are configured to absorb light.

In the existing display device 1, external light may be reflected from the opposite electrode 230 (illustrated in FIG. 6) arranged on an inclined portion IP of a pixel-defining layer and wiring lines near a transmission area, and an external light reflection moire phenomenon occurs due to the reflected light. The moire phenomenon of reflected light may obstruct a user's view when using a display device.

As described in accordance with exemplary embodiments herein, the external light-absorbing layer 350 may be arranged to overlap (cover) an inclined portion IP of a pixel-defining layer and wiring lines 230 around a transmission area in order to block light reflected from the inclined portion IP of the pixel-defining layer and the wiring lines around the transmission area, which cause external light reflection. This may prevent a moire phenomenon due to the external light reflection and image quality characteristics of the display device may be improved.

Referring to FIG. 6, the substrate 100 may include a glass material or a polymer resin, which mainly includes SiO2. The polymer resin may include polyethersulfone, polyacrylate, polyether imide, polyethylene naphthalate, polyethylene terephthalate, polyphenylene sulfide, polyarylate, polyimide, polycarbonate, cellulose acetate propionate, or the like. The substrate 100 including the polymer resin may have a flexible, rollable, or bendable characteristic. In an embodiment, the substrate 100 may include a first substrate 100a, a first barrier layer 100b arranged on the first substrate 100a, a second substrate 100c arranged on the first barrier layer 100b, and a second barrier layer 100d arranged on the second substrate 100c. The first substrate 100a and the second substrate 100c may include polyether imide.

A buffer layer 101 may be positioned on the substrate 100 to reduce or block the penetration of foreign matter, moisture, or outside air from the bottom of the substrate 100, and may provide a flat surface on the substrate 100. The buffer layer 101 may include an inorganic material, such as an oxide or a nitride, an organic material, or an organic-inorganic composite, and may have a single layer or multilayer structure including an inorganic material and an organic material.

A thin film transistor TFT may be arranged on the buffer layer 101. The thin film transistor TFT may include a semiconductor layer 134, a gate electrode 136, a source electrode 137, and a drain electrode 138. The thin film transistor TFT may be connected to a display element 200, for example, an organic light-emitting diode OLED, to drive the organic light-emitting diode. The thin film transistor TFT may thus represent the driving thin film transistor T1.

The semiconductor layer 134 may be arranged on the buffer layer 101 and may include a channel region 131 overlapping (aligned with) the gate electrode 136. A source region 132 and a drain region 133 are arranged on both sides of the channel region 131 and may contain a higher concentration of impurities than the channel region 131. In this case, the impurities may include N-type impurities or P-type impurities. Although not illustrated in the drawings, the source region 132 and the drain region 133 may be electrically connected to the source electrode 137 and the drain electrode 138, respectively.

The semiconductor layer 134 may include an oxide semiconductor and/or a silicon semiconductor. When the semiconductor layer 134 includes an oxide semiconductor, the oxide semiconductor may include an oxide of at least one material selected from, for example, indium (In), gallium (Ga), tin (Sn), zirconium (Zr), vanadium (V), hafnium (Hf), cadmium (Cd), germanium (Ge), chromium (Cr), titanium (Ti), and zinc (Zn). For example, the semiconductor layer 134 may include ITZO(InSnZnO), IGZO(InGaZnO), or the like. When the semiconductor layer 134 includes a silicon semiconductor, the silicon semiconductor may include, for example, amorphous silicon (a-Si) or low temperature poly-silicon (LTPS) crystallized from amorphous silicon (a-Si).

A light-blocking layer (not illustrated) may be arranged on the buffer layer 101. The light-blocking layer may be arranged to correspond to the thin film transistor TFT to prevent the gate electrode, the source electrode, and the drain electrode of the thin film transistor TFT from being visually recognized externally. A voltage may be applied to the light-blocking layer. For example, the light-blocking layer may be connected to the source electrode or the drain electrode of the thin film transistor TFT. The light-blocking layer is supplied with a voltage in conjunction with the potential of the source electrode or the drain electrode of the thin film transistor TFT, and thus, the thin film transistor TFT of the display device may be stabilized. In an embodiment, the light-blocking layer may be connected to a separate wiring line without being connected to the source electrode or the drain electrode of the thin film transistor TFT.

A first insulating layer 103 may be arranged on the semiconductor layer 134 and on the buffer layer 101. The first insulating layer 103 may include at least one inorganic insulator selected from silicon oxide ($SiO_2$), silicon nitride ($SiN_x$), silicon oxynitride (SiON), aluminum oxide ($Al_2O_3$), titanium oxide ($TiO_2$), tantalum oxide ($Ta_2O_5$), hafnium oxide ($HfO_2$), and zinc oxide ($ZnO_2$). The first insulating layer 103 may have a single layer or multilayer structure including the inorganic insulator described above.

The gate electrode 136 may be arranged on the first insulating layer 103. The gate electrode 136 may have a single layer or multilayer structure including one or more metals selected from aluminum (Al), platinum (Pt), palladium (Pd), silver (Ag), magnesium (Mg), gold (Au), nickel (Ni), neodymium (Nd), iridium (Ir), chromium (Cr), lithium (Li), calcium (Ca), molybdenum (Mo), titanium (Ti), tungsten (W), and copper (Cu). The gate electrode 136 may be connected to a gate line to apply an electrical signal to the gate electrode 136.

A second insulating layer 105 may be arranged on the gate electrode 136. The second insulating layer 105 may include at least one inorganic insulator selected from $SiO_2$, $SiN_x$, SiON, $Al_2O_3$, $TiO_2$, $Ta_2O_5$, $HfO_2$, and $ZnO_2$. The second insulating layer 105 may have a single layer or multilayer structure including the inorganic insulator described above.

A storage capacitor Cst may be arranged on the first insulating layer 103. The storage capacitor Cst may include a lower electrode 144 and an upper electrode 146. The storage capacitor Cst may overlap (be formed within) the thin film transistor TFT, and the lower electrode 144 of the storage capacitor Cst may be arranged as a single body with the gate electrode 136 of the thin film transistor TFT. In an embodiment, the storage capacitor Cst may not overlap the thin film transistor TFT, and the lower electrode 144 may be an independent component different from the gate electrode 136 of the thin film transistor TFT.

A third insulating layer 107 may be arranged on the storage capacitor Cst. The third insulating layer 107 may include at least one inorganic insulator selected from $SiO_2$, $SiN_x$, SiON, $Al_2O_3$, $TiO_2$, $Ta_2O_5$, $HfO_2$, and $ZnO_2$. The third insulating layer 107 may have a single layer or multilayer structure including the inorganic insulator described above.

The source electrode 137 and the drain electrode 138 may be arranged on the third insulating layer 107. Each of the source electrode 137 and the drain electrode 138 may include a conductive material including Mo, Al, Cu, Ti, or the like, and have a single layer or multilayer structure including the above material. For example, the source electrode 137 and the drain electrode 138 may have a multilayer structure of Ti/Al/Ti.

A planarization layer 113 may be arranged on the source electrode 137 and the drain electrode 138. The planarization layer 113 may have a flat upper surface such that the pixel electrode arranged thereon may be flat.

When the first insulating layer 103, the second insulating layer 105, and the third insulating layer 107 are collectively referred to as an inorganic insulating layer, a structure in which the inorganic insulating layer is stacked on the substrate 100 may have a transmittance of about 90% or more with respect to an infrared wavelength. For example, light having a wavelength of about 900 nm to about 1100 nm passing through the substrate 100 and the inorganic insulating layer may have a transmittance of about 90%.

The planarization layer 113 may have a single layer or multilayer structure including an organic material or an inorganic material. The planarization layer 113 may include general-purpose polymer, such as benzocyclobutene (BCB), polyimide (PI), hexamethyldisiloxane (HMDSO), polymethylmethacrylate (PMMA), or polystyrene (PS), a polymer derivative having a phenol-based group, acryl-based polymer, imide-based polymer, aryl ether-based polymer, amide-based polymer, fluorine-based polymer, p-xylene-based polymer, vinyl alcohol-based polymer, or a blend thereof. The planarization layer 113 may include $SiO_2$, $SiN_x$, SiON, $Al_2O_3$, $TiO_2$, $Ta_2O_5$, $HfO_2$, $ZnO_2$, or the like. After the forming of the planarization layer 113, chemical mechanical polishing may be performed to provide a flat upper surface.

The planarization layer 113 may include an opening exposing one of the source electrode 137 and the drain electrode 138 of the thin film transistor TFT, and a pixel electrode 210 may contact the source electrode 137 or the drain electrode 138 through the opening to be electrically connected to the thin film transistor TFT.

When the planarization layer 113 is referred to as an organic insulating layer, the organic insulating layer may have a transmittance of about 90% or more with respect to the infrared wavelength. For example, light having a wavelength of about 900 nm to about 1100 nm passing through the organic insulating layer may have a transmittance of about 90%.

On the planarization layer 113, the display element 200 may include the pixel electrode 210, an intermediate layer 220, and an opposite electrode 230 facing the pixel electrode 210 with the intermediate layer 220 there between. For example, the display element 200 including the pixel electrode 210, the intermediate layer 220, and the opposite electrode 230 may be an organic light-emitting diode OLED.

The pixel electrode 210 may be arranged on the planarization layer 113. The pixel electrode 210 may be a (semi) transparent electrode or a reflective electrode. The pixel electrode 210 may include a reflective electrode including Ag, Mg, Al, Pt, Pd, Au, Ni, Nd, Ir, Cr, a compound thereof, or the like, and a transparent or semi translucent electrode layer formed on the reflective layer. The transparent or semi transparent electrode layer may include at least one selected from indium tin oxide (ITO), indium zinc oxide (IZO), zinc oxide (ZnO), indium oxide (In2O3), indium gallium oxide (IGO), and aluminum zinc oxide (AZO). The pixel electrode 210 may have a stacked structure of ITO/Ag/ITO.

A pixel-defining layer 180 may be arranged on the planarization layer 113, and the pixel-defining layer 180 may include a first opening OP1 exposing at least a portion of the pixel electrode 210. The first opening OP1 may have a first width w1. The pixel-defining layer 180 may be configured to increase a distance between an end of the pixel electrode 210 and the opposite electrode 230 above the pixel electrode 210. Thus, an arc may be prevented from occurring in the end of the pixel electrode 210. The pixel-defining layer 180 may include an organic insulating material, such as polyimide, polyamide, acrylic resin, benzocyclobutene, hexamethyldisiloxane, or phenol resin, and may be formed using a method such as spin coating. The emission area EA of each pixel may be defined by the first opening OP1 of the pixel-defining layer 180.

A spacer 190 may be arranged on the pixel-defining layer 180. The spacer 190 may prevent layers interposed between the substrate 100 and the spacer 190 to be damaged by a mask used in a process of forming the intermediate layer 220 to be described later. The spacer 190 may include a material that is the same as that of the pixel-defining layer 180 and may be formed simultaneously with the pixel-defining layer 180 by using a halftone mask. In an embodiment, the pixel-defining layer 180 and the spacer 190 may be arranged on the planarization layer 113 of the transmission area TA. In another embodiment the pixel-defining layer 180 and spacer 190 may be formed in separate steps. The spacer 190 may be formed to include upwards and outwards in a similar manner to the pixel defining layer 180.

The intermediate layer 220 may be arranged in the first opening OP1 of the pixel-defining layer 180 to correspond to the pixel electrode 210.

The intermediate layer 220 may include an emission layer (EML) and may further include functional layers, such as a hole transport layer (HTL), a hole injection layer (HIL), an electron transport layer (ETL), and an electron injection layer (EIL), which are optionally arranged under and on the emission layer.

The EML may include an organic material including a fluorescent or phosphorescent material emitting red, green, blue, or white light. The EML may include a low molecular weight organic material or a polymer organic material.

When the EML includes a low molecular weight organic material, the intermediate layer 220 may have a structure in which an HIL, an HTL, an EML, an ETL, and an EIL are stacked in a single or composite structure, and may include various organic materials, such as copper phthalocyanine (CuPc), N,N'-Di(napthalene-1-yl)-N,N'-diphenyl-benzidine:

NPB), and tris-8-hydroxyquinoline aluminum)(Alq₃)). These layers may be formed using a method such as vacuum deposition.

When the EML includes a polymer material, the intermediate layer 220 may have a structure including an HTL and an EML. In this case, the HTL may include poly(3,4-ethylenedioxythiophene) (PEDOT), and the EML may include a polymer material, such as polyphenylene vinylene-based polymer or polyfluorene-based polymer. The emission layer may be formed using screen printing or inkjet printing, or laser induced thermal imaging (LITI).

The opposite electrode 230 may be arranged on the intermediate layer 220. The opposite electrode 230 may be arranged on the intermediate layer 220 so as to entirely cover the intermediate layer 220. The opposite electrode 230 may be arranged above the display area DA so as to entirely cover the display area DA. That is, the opposite electrode 230 may be formed as a single body so as to cover the plurality of pixels P arranged in the display area DA. For example, at least a portion of the opposite electrode 230 may be arranged to extend toward and into the transmission area TA.

The opposite electrode 230 may include a conductive material having a low work function. For example, the opposite electrode 230 may include a (semi) transparent layer including Ag, Mg, Al, Pt, Pd, Au, Ni, Nd, Ir, Cr, Li, Ca, an alloy thereof, or the like. Alternatively, the opposite electrode 230 may further include a layer including a material, such as ITO, IZO, ZnO, or $In_2O_3$, on the (semi) transparent layer including the aforementioned material.

The display element 200 including the pixel electrode 210, the intermediate layer 220, and the opposite electrode 230 may be covered with the thin film encapsulation layer 300. The thin film encapsulation layer 300 may include at least one inorganic encapsulation layer and at least one organic encapsulation layer. In an embodiment, the thin film encapsulation layer 300 may include a first inorganic encapsulation layer 310, a second inorganic encapsulation layer 330, and an organic encapsulation layer 320 arranged there between.

The first inorganic encapsulation layer 310 and the second inorganic encapsulation layer 330 may each include one or more inorganic insulators. The inorganic insulators may include $Al_2O_3$, $TiO_2$, $Ta_2O_5$, $HfO_2$, $ZnO_2$, $SiO_2$, $SiN_x$, and/or SiON. The organic encapsulation layer 320 may include a polymer-based material. The polymer-based material may include acrylic resin, epoxy resin, polyimide, polyethylene, and the like. For example, the organic encapsulation layer 320 may include an acrylic resin such as polymethyl methacrylate or polyacrylic acid.

The external light-absorbing layer 350 may be arranged on the thin film encapsulation layer 300. The external light-absorbing layer 350 may at least partially overlap and extend within the emission area EA and may be arranged on the thin film encapsulation layer 300. The EA may initially be defined by the area created by the inclined walls of the pixel defining layer 180. The EA may start at an initial exposed portion where the pixel electrode 210 meets the pixel defining layer 180. A thickness of the external light-absorbing layer 350 may be about 0.5 μm to about 3 μm. In an embodiment, the external light-absorbing layer 350 may be directly arranged on the second inorganic encapsulation layer 330.

The external light-absorbing layer 350 may include a second opening OP2 exposing at least a portion of the thin film encapsulation layer 300. For example, the second opening OP2 of the external light-absorbing layer 350 may expose at least a portion of the second inorganic encapsulation layer 330. The second opening OP2 exposing at least a portion of the thin film encapsulation layer 300 may have a second width w2. The second width w2 of the second opening OP2 may be less than the first width w1 of the first opening OP1.

The width w2 may align with planar portions of the pixel electrode 210, intermediate layer 220, and opposite electrode 230, inside the inclined portions IP of the pixel defining layer 180. Thus the width w2 of the second opening OP2 may not include the inclined portions IP of the pixel defining layer 180. Thus the external light absorbing layer 350 may be positioned over the inclined portions IP of the display element 200.

Because the width of the second opening OP2 defined in the external light-absorbing layer 350 is smaller than the width of the first opening OP1 defined in the pixel-defining layer 180, external light may be blocked from being reflected from the opposite electrode 230 arranged on the inclined portion IP of the pixel-defining layer 180, thereby preventing the occurrence of the moire phenomenon.

Figure 7A:
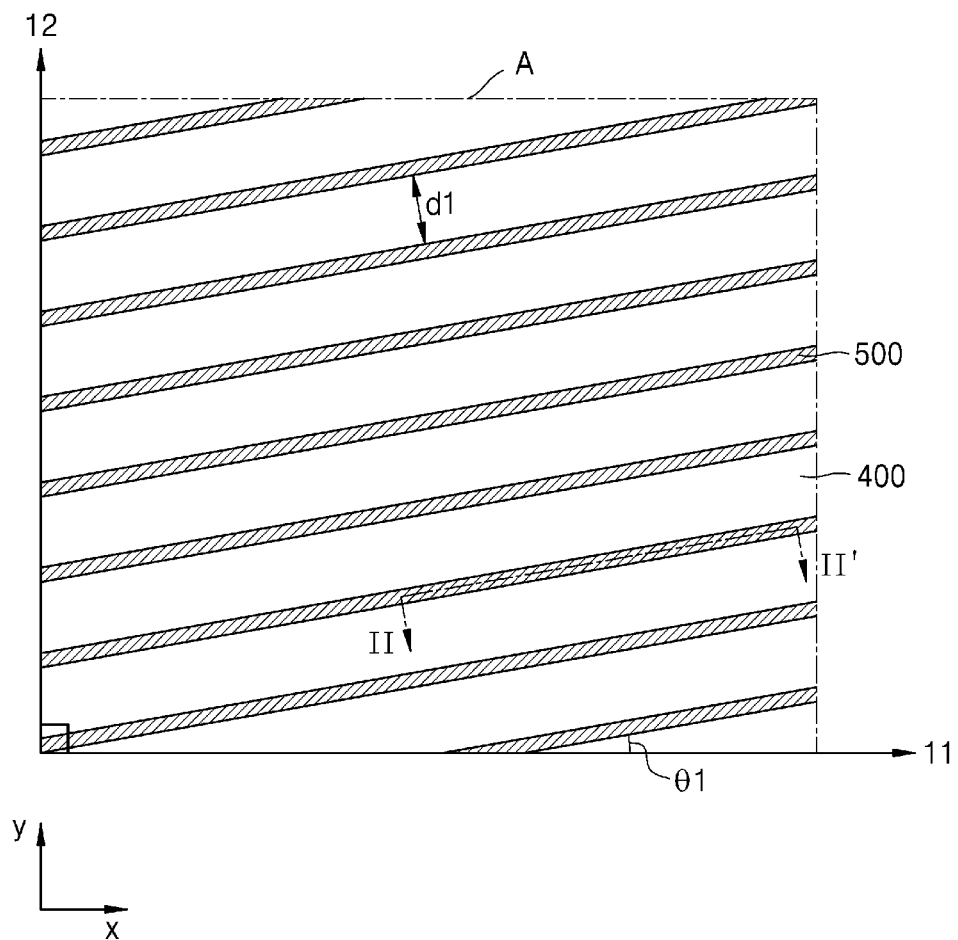
FIGS. 7A and 7B are plan views illustrating a portion of a display area in a display device according to embodiments described herein.
Figure 7B:
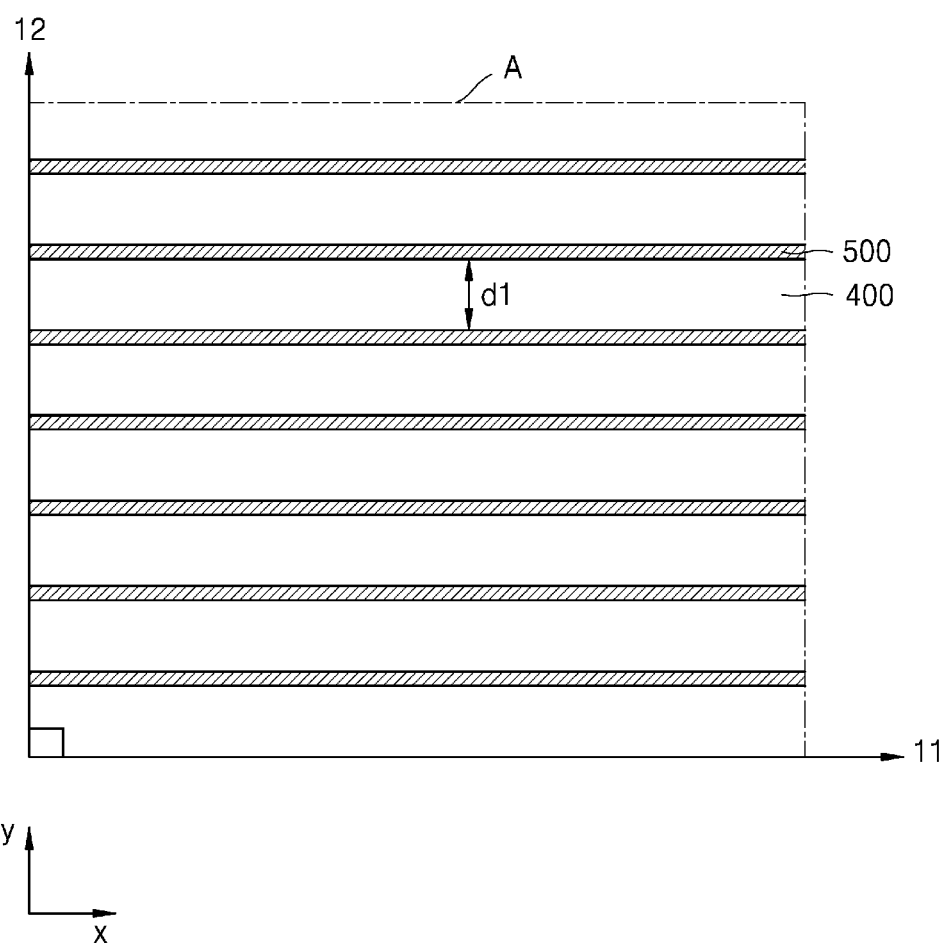
Figure 8:
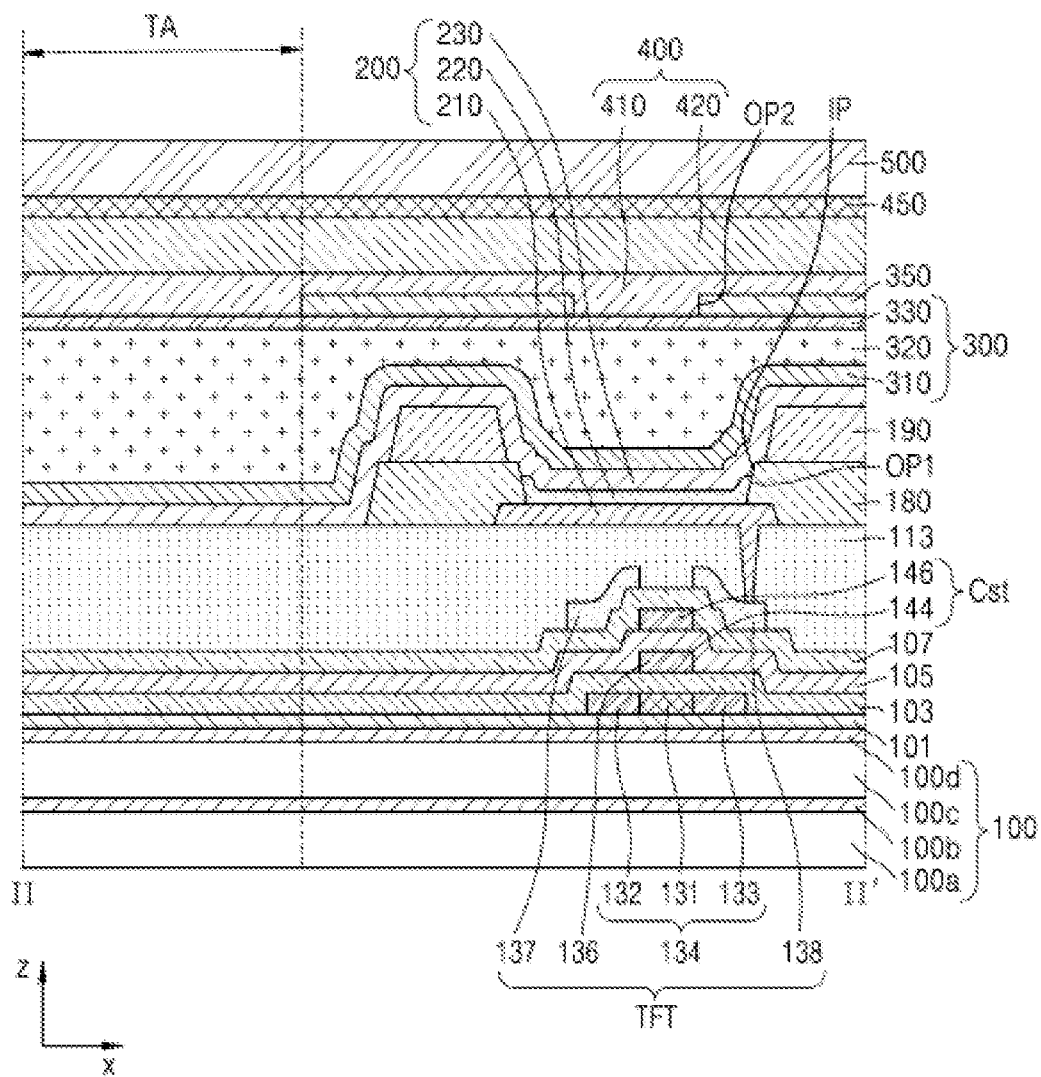
FIG. 8 is a cross-sectional view schematically illustrating a display device according to embodiments described herein.

FIGS. 7A and 7B are plan views illustrating a portion of a display area DA in a display device 1 according to embodiments described herein, and FIG. 8 is a cross-sectional view schematically illustrating a display device 1 according to embodiments described herein. In FIGS. 7A and 7B, a transmission area TA may be provided as in FIGS. 5A and 5B, but is omitted for convenience of description.

Referring to FIGS. 7A and 8, a polarizing plate 400 may be arranged on the external light-absorbing layer 350, and a plurality of light control films 500 may be arranged on the polarizing plate 400. Each of the light control films 500 may be spaced apart by a first distance dl. In an embodiment, the first distance dl may be about 35 μm to about 55 μm. For example, the first distance dl may be variously changed and may be, for example, about 30 μm to about 60 μm or about 25 μm to about 65 μm.

Each of the light control films 500 may form a first inclination angle $\theta 1$ with a first axis 11 of a plane including the first axis 11 extending in a first direction (i.e., x direction) and a second axis 12 extending in a second direction (i.e., y direction) crossing the first direction, and may be arranged on the polarizing plate 400. The first inclination angle $\theta 1$ formed by each light control film 500 with the first axis 11 may be 30 degrees or less. In this case, the first inclination angle $\theta 1$ may be greater than 0 degrees. The first inclination angle $\theta 1$ formed by each light control film 500 with the first axis 11 may be variously changed. For example, the first inclination angle $\theta 1$ may be greater than 0 degrees and less than or equal to 29 degrees, may be greater than 0 degrees and less than or equal to 20 degrees, or may be greater than 0 degrees and less than or equal to 3 degrees.

When the inclination angle $\theta 1$ formed by the light control film 500 with the first axis 11 is 30 degrees or less, a moire phenomenon may occur due to external light reflection. When the inclination angle $\theta 1$ formed by the light control film 500 with the first axis 11 is 20 degrees or 27.5 degrees, the moire phenomenon due to external light reflection occurs weakly. However, when the inclination angle $\theta 1$ slightly deviates from 20 degrees or 27.5 degrees, the moire phenomenon becomes worse.

Exemplary embodiments of the present disclosure address these and other issues. The external light-absorbing layer 350 that absorbs external light is arranged to overlap an inclined portion IP of the pixel-defining layer 180 and wiring lines near the transmission area TA. Arranged in this manner the external light-absorbing layer 350 may block light reflected from the inclined portion IP of the pixel-defining layer 180 and the wiring lines near the transmission area TA, which cause external light reflection. Using this structure may prevent a moire phenomenon due to the external light reflection from internal layers.

In addition, by reducing the inclination angle θ1 formed by the light control film 500 with the first axis 11 extending in the first direction (i.e., x direction), light emitted from the display element 200 may not be emitted in an upward direction. Thus, if used in an automotive setting, information necessary for a driver may be provided without disturbing the driver's view.

In an embodiment, as illustrated in FIG. 7B, each light control film 500 may be arranged on the polarizing plate 400 in parallel with the first axis 11 extending in the first direction (i.e., x direction). Because the light control film 500 is arranged on the polarizing plate 400 in parallel with the first axis 11 extending in the first direction (i.e., x direction), external light reflected from the display element 200 may not be emitted in an upward direction, and thus in an automotive setting, information necessary for a driver may be provided without disturbing the driver's view.

As illustrated in FIG. 8, a polarizing plate 400 may be arranged on the external light-absorbing layer 350. The polarizing plate 400 may include a polarization adhesive layer 410 and a polarization layer 420. The polarization adhesive layer 410 may adhere the polarization layer 420 to the thin film encapsulation layer 300. In an embodiment, the polarization adhesive layer 410 may be omitted. The polarization layer 420 may include a phase retarder and a polarizer. The phase retarder may be of a film type or a liquid crystal coating type and may include a λ/2 phase retarder and/or a λ/4 phase retarder. The polarizer may also be of a film type or a liquid crystal coating type. The film type may include an elongate synthetic resin film, and the liquid crystal coating type may include liquid crystals arranged in a predetermined arrangement. The phase retarder and the polarizer may further include protective films. In an embodiment, the polarization layer 420 may include a destructive interference structure. The destructive interference structure may include a first reflective layer and a second reflective layer respectively arranged on different layers. First reflected light and second reflected light reflected by the first reflective layer and the second reflective layer, respectively, may create a destructive interference with each other, and thus, external light reflectance may be reduced.

The plurality of light control films 500 may be spaced apart from each other by the first distance dl and arranged on the polarizing plate 400. Each of the light control films 500 is an optical film configured to adjust light transmittance, and may prevent light emitted from the display element 200 from being emitted in a certain direction. The light control film 500 may be arranged on the polarizing plate 400. A thickness of the light control film 500 may be about 80 μm to about 120 μm.

An adhesive layer 450 may be positioned between each of the light control films 500 and the polarizing plate 400. The adhesive layer 450 may adhere each of the light control films 500 to the polarizing plate 400. In an embodiment, the adhesive layer 450 may be omitted.

Until now, only the display device has been mainly described, but the present disclosure is not limited thereto. For example, a method of manufacturing the display device described above is also within the scope of the present disclosure.

As described above, according to one or more embodiments of the present disclosure, by placing an external light-absorbing layer on a thin film encapsulation layer, a display device, which prevents occurrence of a moire phenomenon due to external light reflection and has improved image quality characteristics, may be implemented. However, the scope of the present disclosure is not limited by these effects.

One or more embodiments may include a display device configured to prevent occurrence of a moire phenomenon due to external light reflection and has improved image quality characteristics. However, these objectives are merely examples and the scope of the present disclosure is not limited thereby.

Although certain exemplary embodiments and implementations have been described herein, other embodiments and modifications will be apparent from this description. Accordingly, the inventive concepts are not limited to such embodiments, but rather to the broader scope of the appended claims and various obvious modifications and equivalent arrangements as would be apparent to a person of ordinary skill in the art.

What is claimed is:

1. A display device comprising:
   a substrate including a transmission area and an emission area defined by a pixel-defining layer;
   a display element including a pixel electrode at least partially exposed by the pixel-defining layer, an intermediate layer arranged on the pixel electrode, and an opposite electrode arranged on the intermediate layer;
   a thin film encapsulation layer arranged on the display element, the thin film encapsulation layer including at least one inorganic encapsulation layer and at least one organic encapsulation layer;
   an external light-absorbing layer at least partially overlapping the emission area and arranged on the thin film encapsulation layer;
   a polarizing plate arranged on the external light-absorbing layer; and
   a plurality of light control films arranged on the polarizing plate and spaced apart from each other by a first distance.

2. The display device of claim 1, wherein the pixel-defining layer includes a first opening exposing at least a portion of the pixel electrode and the external light-absorbing layer includes a second opening exposing at least a portion of the thin film encapsulation layer.

3. The display device of claim 2, wherein the first opening in the pixel-defining layer has a first width, and the second opening in the external light-absorbing layer has a second width less than the first width.

4. The display device of claim 1, wherein the external light-absorbing layer has a thickness of about 0.5 μm to about 3 μm and is arranged on the thin film encapsulation layer.

5. The display device of claim 1, wherein the thin film encapsulation layer includes:
   a first inorganic encapsulation layer arranged on the display element;
   an organic encapsulation layer arranged on the first inorganic encapsulation layer; and
   a second inorganic encapsulation layer arranged on the organic encapsulation layer.

6. The display device of claim 5, wherein the external light-absorbing layer is arranged directly on the second inorganic encapsulation layer.

7. The display device of claim 1, further comprising a spacer arranged on the pixel-defining layer, wherein the spacer and the pixel-defining layer include a same material.

8. The display device of claim 1, wherein each of the light control films is arranged on the polarizing plate and forms a first inclination angle with a first axis of a plane including the first axis extending in a first direction and a second axis extending in a second direction crossing the first direction.

9. The display device of claim 8, wherein the first inclination angle is 30 degrees or less.

10. The display device of claim 1, wherein the first distance is about 35 μm to about 55 μm.

11. The display device of claim 1, wherein each of the light control films has a thickness of about 80 μm to about 120 μm and is arranged on the polarizing plate.

12. The display device of claim 1, wherein at least a portion of the opposite electrode extends toward the transmission area.

13. A display device comprising:
- a substrate including a transmission area and an emission area defined by a pixel-defining layer;
- a display element including a pixel electrode at least partially exposed by the pixel-defining layer, an intermediate layer arranged on the pixel electrode, and an opposite electrode arranged on the intermediate layer;
- a thin film encapsulation layer arranged on the display element, the thin film encapsulation layer including at least one inorganic encapsulation layer and at least one organic encapsulation layer;
- an external light-absorbing layer arranged on the thin film encapsulation layer;
- a plurality of light control films arranged on the external light-absorbing layer and spaced apart from each other by a first distance; and
- a polarizing plate arranged between the external light-absorbing layer and the plurality of light control films.

14. The display device of claim 13, wherein the pixel-defining layer includes a first opening exposing at least a portion of the pixel electrode and the external light-absorbing layer includes a second opening exposing at least a portion of the thin film encapsulation layer.

15. The display device of claim 14, wherein the first opening in the pixel-defining layer has a first width, and the second opening in the external light-absorbing layer has a second width less than the first width.

16. The display device of claim 14, wherein the external light-absorbing layer at least partially overlaps the emission area and is arranged on the thin film encapsulation layer.

17. The display device of claim 13, wherein each of the light control films is arranged on the polarizing plate and forms a first inclination angle with a first axis on a plane including the first axis extending in a first direction and a second axis extending in a second direction crossing the first direction.

18. The display device of claim 17, wherein the first inclination angle is 30 degrees or less.

* * * * *